(12) United States Patent  
Kuhn et al.

(10) Patent No.: US 7,613,592 B2
(45) Date of Patent: Nov. 3, 2009

(54) TWO-CHANNEL METHOD FOR CONTINUOUSLY DETERMINING AT LEAST ONE OUTPUT SIGNAL FROM CHANGING INPUT SIGNALS

(75) Inventors: Andreas Kuhn, Erlangen (DE); Günter Schwesig, Erlangen (DE)

(73) Assignee: Siemens Aktiengeseschaft, Munich (DE)

( * ) Notice: Subject to any disclaimer, the term of this patent is extended or adjusted under 35 U.S.C. 154(b) by 49 days.

(21) Appl. No.: 11/885,817

(22) PCT Filed: Mar. 9, 2006

(86) PCT No.: PCT/EP2006/060604

§ 371 (c)(1),
(2), (4) Date: Sep. 6, 2007

(87) PCT Pub. No.: WO2006/095012

PCT Pub. Date: Sep. 14, 2006

(65) Prior Publication Data

US 2008/0176530 A1    Jul. 24, 2008

(30) Foreign Application Priority Data

Mar. 11, 2005   (DE)  ........................ 10 2005 011 406

(51) Int. Cl.
*H04B 15/00*    (2006.01)

(52) U.S. Cl. .................................................... 702/189
(58) Field of Classification Search .................. 702/189
See application file for complete search history.

(56) References Cited

U.S. PATENT DOCUMENTS

| 4,079,374 | A | | 3/1978 | Cox, Jr. |
| 4,989,001 | A | | 1/1991 | Serev |
| 5,579,251 | A | * | 11/1996 | Sato ........................... 702/117 |
| 2002/0021468 | A1 | * | 2/2002 | Kato et al. ................... 359/152 |
| 2002/0173931 | A1 | | 11/2002 | Dudler et al. |

FOREIGN PATENT DOCUMENTS

| DE | 10035174 A1 | 6/2001 |
| DE | 10235502 C1 | 12/2003 |
| JP | 07036512 A | 2/1995 |

* cited by examiner

*Primary Examiner*—Bryan Bui

(57) ABSTRACT

There is described a two-channel method for determining at least one output signal from variable input signals sent by a transmitter, using two independent channels and consisting in alternately guiding the input signals to said channels, wherein a multiplexer is used for switching said channels. A microprocessor contained in said channels delivers input test signals transmitted to the channel not currently receiving any variable input signal. Said channel transmits output signals compared with an expected value in order to verify the channel correct operation. Simultaneously, the other channel produces an output signal. Afterwards, the multiplexer switches a control signal.

19 Claims, 1 Drawing Sheet

TWO-CHANNEL METHOD FOR CONTINUOUSLY DETERMINING AT LEAST ONE OUTPUT SIGNAL FROM CHANGING INPUT SIGNALS

CROSS REFERENCE TO RELATED APPLICATIONS

This application is the US National Stage of International Application No. PCT/EP2006/060604, filed Mar. 9, 2006 and claims the benefit thereof. The International Application claims the benefits of German application No. 10 2005 011 406.7 DE filed Mar. 11, 2005, both of the applications are incorporated by reference herein in their entirety.

FIELD OF INVENTION

The present invention relates to the evaluation of signals of the kind fed out by optical or magnetic transmitter systems that can be attached to motors on a machine tool.

The invention relates also to an integrated circuit for evaluating the signals from the transmitter system and to a transmitter system of said type together with an integrated circuit.

BACKGROUND OF INVENTION

The present invention belongs to the domain "safety in the technical drive and control system for, for instance, machine tools". A motor serves in a machine tool inter alia to change a tool's position and speed or, as the case may be, rotational speed. For example magnetic or optical transmitter systems are located directly on the motor in order to register said position and speed. Optical transmitter systems, for example, include a light-emitting diode that sends light to two phototransistors via a glass disk that is provided with slits and rotates with the motor. The phototransistors' signals are the transmitter system's output signals and are in particular sinusoidal and cosinusoidal. Said signals must be evaluated in such a way as to obtain at least one actual position value for the tool. It should further be possible to determine the tool's revolution rate or speed from the position and sampling time. The setpoint position value is predetermined by the geometry of the work piece being worked. The position controller uses the actual position value for setting the setpoint position value.

The sine and cosine curves are interpolated by electronic circuitry to produce the actual position value. An analog-to-digital converter converts the analog signals into digital signals and the number of zero crossings of the sine or, as the case may be, cosine curves is determined in order to establish the ordinal of the sine or, as the case may be, cosine curve currently being fed out by the transmitter system. To finely determine the angle, the sine is divided by the cosine and the tangential arc determined from the resulting value. Because the glass disk provided with slits has, for example, 2,048 slits, 2,048 sine or, as the case may be, cosine curves are obtained for each revolution of the motor. The tangential arc can have been resolved repeatedly into, for example, 2,048 individual steps. Approximately four million possible items of information will thus be obtained for each revolution of the motor.

The cited electronic circuitry is, though, very interference-prone. To allow for its proneness to interference, two channels are employed in the prior art:

The signals from the transmitter are processed mutually independently in two identical channels. The actual position value determined by one channel is compared with the actual position value determined in the other. If the actual position values tally within certain tolerances, then the actual position value of one of the two channels will be used as the output signal. There will be an error message if the two channels' actual position values do not tally. Because the position controller will no longer be able to operate reliably, the entire machine will be stopped.

It is a requirement of Germany's TÜV (Technical Supervision Authority) or, as the case may be, of that country's em-ployer's liability insurance association for the two channels, which are provided by means of electronic components on sili-con chips, not to be provided on the same chip or at least to be separated by means of a silicon trench. The reason is that similar errors not detectable through the mutual comparison of the channels may otherwise occur in channels 1 and 2.

The consequences of providing two different chips are high costs and large space requirements. A plurality of housings have to be provided. Although a possibility, the solution employing a silicon trench is uneconomical because the trench width will need to accord with the specific ambient temperature range. An increase in temperature due to a defect in one channel must not lead to an impermissible increase in tempera-ture in the other. For applications having high permissible ambient temperatures the silicon surface will accordingly in-crease uneconomically as its portion of the trench.

Described in U.S. Pat. No. 4,079,374 is a system for analyzing sinusoidal and cosinusoidal input signals onto which a phase has been impressed by a resolver. A first phase-locked loop feeds the phase out. A second phase-locked loop can be provided which feeds out a derivation of the phase.

SUMMARY OF INVENTION

An object of the invention is to provide a compact solution for allowing the transmitter signals to be processed on one silicon chip while at the same time allowing the security of both channels' monitoring to be insured.

Said object is achieved by means of a method according to an independent claim as well as by means of a transmitter system having an integrated circuit of said type.

The invention is based on the knowledge that although there have to be two different channels, only a single output signal is ever required. The output signal can hence in each case be produced in one channel and a check performed in the other to determine whether it is operating correctly. As that takesplace in alternation, in changeover mode (using a multiplexer), the result is high speed in determining errors in one of the channels.

The input signals are for that purpose fed to and the output signal taken from in each case one of the channels, and test input signals for which an expected value is known for the output signal are fed to the respective other of the channels and the output signal is determined from said test input signals via the customary route and compared with the expected value to check whether the respective other channel is operating correctly, while the one channel serves simultaneously to produce the output signal.

The integrated circuit has for that purpose:
- a first channel for producing at least one output signal from changing input signals and
- an identical second channel, likewise for producing the output signal from the changing input signals, employed in alternation with the first channel,
- a changeover switch (multiplexer) for changing over between the channels,
- a device for producing test input signals, and a data link from the device to the changeover switch for feeding the test input signals in an alternating manner to in each case the channel currently not being used for producing the output signal.

The input signals being as a rule analog signals, each channel preferably includes an analog-to-digital converter and a downstream digital evaluation circuit and/or a microprocessor for evaluating the digital signals. The microprocessor in one of the channels preferably provides the test input signals, which are then converted via a digital-to-analog converter in the data link into analog test input signals.

The changeover switch can be controlled by the microprocessor by means of a changeover signal.

The input signals are in a preferred embodiment fed having reverse polarity to the second channel. The sinusoidal signal and cosinusoidal signal are thus reversed in their roles. Signal processing must accordingly be matched to the reversed signal input, and the test signals must also be applied accordingly.

BRIEF DESCRIPTION OF THE DRAWINGS

A preferred embodiment of the invention will now be described with reference to the drawings.

DETAILED DESCRIPTION OF INVENTION

Figure 1:
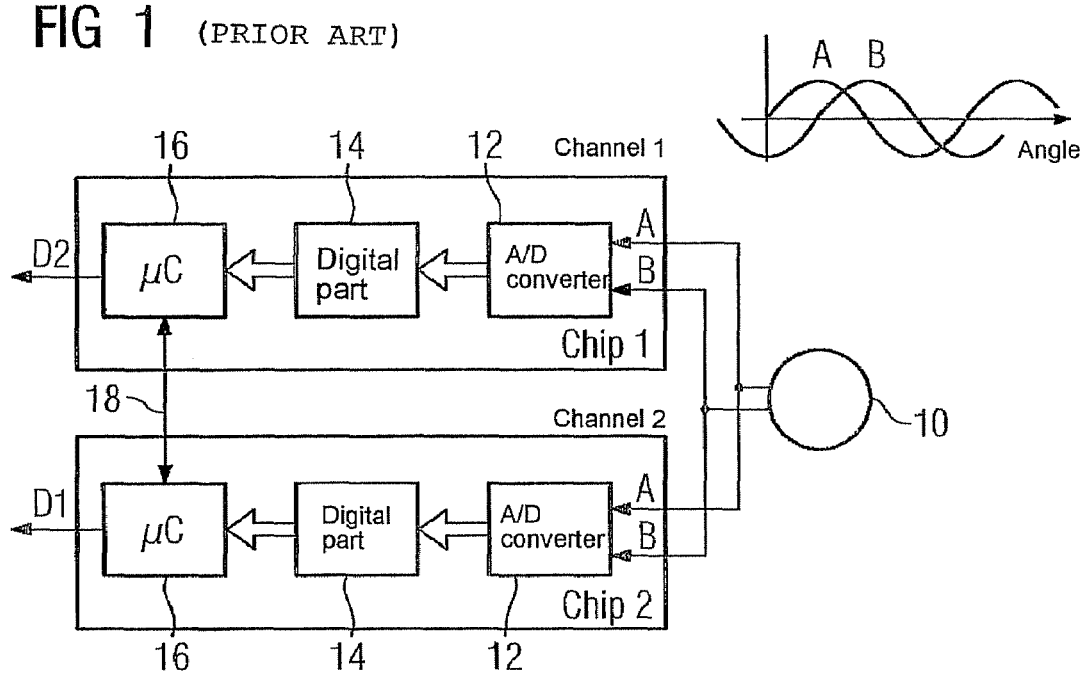
FIG. 1 shows the structure of a system for processing transmitter signals according to the prior art.
Figure 2:
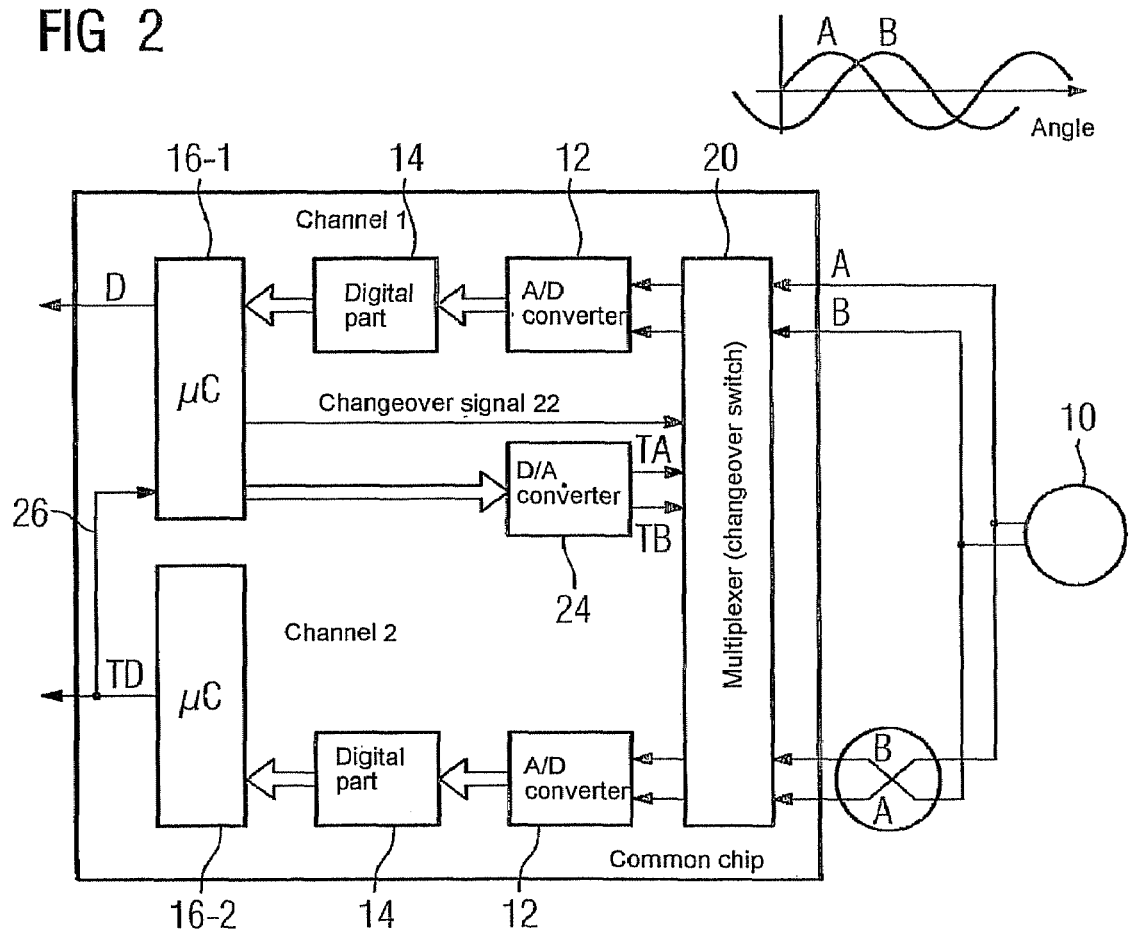
FIG. 2 illustrates the structure of a system for processing transmitter signals according to the invention.

A transmitter 10, which can be an optical or a magnetic transmitter, feeds out the sinusoidal signal A and the cosinusoidal signal B as input signals for two channels on two different chips. In each chip an analog-to-digital converter 12 converts the analog signals into digital signals. The signal is further evaluated in a digital part 14 and a downstream microcomputer 16. The number of zero crossings of the sine stands therein for the extent of the rotation of the motor which the transmitter system is observing, and for fine measuring the precise angle of the input signal is determined by calculating the tangential arc from the ratio of the signal A to the signal B. The two microcomputers 16 feed out signals D1 and D2 each representing the position of a tool or work piece. The two signals D1 and D2 are mutually compared via a connecting lead 18, with the comparison preferably being able to take place in both microcomputers 16. If the values D1 and D2 diverge too much, then an error and stop signal will be fed out instead, as a result of which the motor will stop. The two channels 1 and 2 are, as shown, located on different chips. The two-channel embodiment appears here to be very complex and of little effect, but necessary for safety reasons. The invention, shown in FIG. 2, now enables the channels to be embodied on one, common chip. Analog-to-digital converters 12, digital parts 14, and microcomputers 16 are provided here, too. A multiplexer (changeover switch) 20 is, though, connected upstream of the analog-to-digital converters. Said multiplexer receives the signals A and B from the transmitter, with switching taking place crosswise in terms of channel 2, meaning that the signal inputs for A and B have been reversed, a fact requiring to be taken into account by the associated microcomputer.

One of the microcomputers, in this example the microcomputer 16-1, now has a heightened significance (master). The other microcomputer 16-2, by contrast, retains a subordinate significance (slave). As a function of the data it receives, the computer 16-1 sends on the one hand a changeover signal 22 to the multiplexer 20 and, on the other, test input signals TA and TB to the multiplexer via a digital-to-analog converter 24. The input signals A and B are in the case illustrated now being applied to channel 1. Channel 1 produces an output signal D. That is used for position controlling and controlling the revolution rate. Channel 2 is simultaneously tested:

The test signals TA and TB are applied to channel 2 and are evaluated there as though they were ordinary signals A and B. The microcomputer 16-2 then feeds out a test output signal TD that is conveyed to the microcomputer 16-1 via a data line 26. The microcomputer makes a comparison to determine whether the test output signal TD tallies with the expected value for the test input signals TA and TB. If it does (within certain tolerances, where applicable), the microcomputer will feed out the changeover signal 22. The input of channel 1 is then disconnected and the multiplexer 20 changes over instead to channel 2, which henceforth receives the real signals B and A. The output signal from the microcomputer 16-2 thus serves for position controlling, while the test signals TA and TB will then be fed simultaneously to the input of channel 1. A comparison is made here, too, to determine whether the resulting end signal tallies with the expected value of the test signals TA and TB.

The test signals TA and TB can have been matched to the respectively current signals A and B, with the microcomputer's being able to calculate said test signals using formulas or to take them from a table of test input signals and expected values.

Thus only one channel is inventively ever used for producing the output signal, with a check being performed simultaneously on the other to determine whether it is operating correctly. Because changing between both channels takes place at a very fast rate (for example once a second), errors suddenly occurring for example after a few hours' continuous operation can be detected relatively quickly. Being operated mutually independently and in alternation, the channels can now be accommodated on one, common chip, something with which not even Germany's TÜV (Technical Supervision Authority) is likely to further find fault.

The invention claimed is:

1. A method for continuously determining at least one output signal based on changing input signals, comprising:
   providing a chip with a first channel and a second channel, the first channel having a first microprocessor and the second channel having a second microprocessor;
   feeding the input signals to the first channel, the input signals being provided by a transmitter;
   producing an output signal based on the input signals and taking the output signal from the first channel;
   feeding test input signals to the second channel, an expected value being known for a test output signal, the test input signals being generated by the first microprocessor;
   determining the test output signal based on the test input signals; and
   comparing the test output signal with the expected value to check whether the second channel is operating correctly.

2. The method as claimed in claim 1, wherein the input signals and the test input signals are fed in alternation simultaneously to the first and second channel, the first and second channel being mutually independent and the input signals being identically processed in the first and second channel for producing the output signal.

3. The method as claimed in claim 1, wherein the input signals are signals from a magnetic transmitter system or an optical transmitter system.

4. The method as claimed in claim 3, wherein the transmitter system is associated with a component of a machine, and wherein the output signal indicates an actual position value of the machine's component.

5. The method as claimed in claim 3, wherein the input signals have a sinusoidal value and a cosinusoidal value.

6. The method as claimed in claim 5, wherein a signal processing includes counting zero crossings of curves and determining a tangential arc in terms of the ratio of the two input signals.

7. The method as claimed in claim 1, wherein an error signal or stop signal is fed out when the output signal does not tally within tolerance limits with the expected value.

8. The method as claimed in claim 1, wherein the input signals are analog signals of sensors.

9. An integrated circuit, comprising:
a first channel for producing at least one output signal based on changing input signals;
a second channel identical to the first channel, likewise for producing the output signal based on the changing input signals, employed in alternation with the first channel;
a multiplexer for changing over between the first channel and the second channel;
a microprocessor configured to generate test input signals; and
a data link from the microprocessor to the multiplexer for feeding the test input signals in an alternating manner to in each case the channel currently not being used for producing the output signal.

10. The integrated circuit as claimed in claim 9, wherein the first channel and the second channel have an analog-to-digital converter and a digital part being configured as a digital evaluation circuit.

11. The integrated circuit as claimed in claim 9, wherein the first channel and the second channel have an analog-to-digital converter and a microprocessor.

12. The integrated circuit as claimed in claim 11, wherein the microprocessor controls the multiplexer based upon a changeover signal.

13. The integrated circuit as claimed in claim 9, wherein the data link has a digital-to-analog converter.

14. The integrated circuit as claimed in claim 9, wherein the microprocessor is located in one of the channels.

15. The integrated circuit as claimed in claim 9, wherein the input signals fed to the channels have reverse polarity.

16. The integrated circuit as claimed in claim 9, wherein the integrated circuit is connected to a transmitter system attached to a component of a machine, and wherein the output signal is based upon a sinusoidal input signal and a cosinusoidal input signal.

17. The integrated circuit as claimed in claim 16, wherein the transmitter system is a magnetic transmitter system.

18. The integrated circuit as claimed in claim 16, wherein the transmitter system is an optical transmitter system.

19. The integrated circuit as claimed in claim 16, wherein the output signal is used by an electronic position controller for the component of the machine.

* * * * *